(12) United States Patent
Migliazza et al.

(10) Patent No.: US 11,588,451 B2
(45) Date of Patent: Feb. 21, 2023

(54) AMPLIFIER FOR DRIVING A CAPACITIVE LOAD

(71) Applicant: SYSTEM CERAMICS S.P.A., Modena (IT)

(72) Inventors: Giovanni Migliazza, Catanzaro (IT); Luca Larcher, Reggio Emilia (IT); Emilio Lorenzani, Parma (IT)

(73) Assignee: SYSTEM CERAMICS S.P.A., Modena (IT)

( * ) Notice: Subject to any disclaimer, the term of this patent is extended or adjusted under 35 U.S.C. 154(b) by 445 days.

(21) Appl. No.: 16/964,532

(22) PCT Filed: Jan. 25, 2019

(86) PCT No.: PCT/IB2019/050622
§ 371 (c)(1),
(2) Date: Jul. 23, 2020

(87) PCT Pub. No.: WO2019/145903
PCT Pub. Date: Aug. 1, 2019

(65) Prior Publication Data
US 2021/0036668 A1    Feb. 4, 2021

(30) Foreign Application Priority Data

Jan. 26, 2018   (IT) .................... 102018000001967

(51) Int. Cl.
*H03F 1/02*        (2006.01)
*H03F 3/217*       (2006.01)
(Continued)

(52) U.S. Cl.
CPC ........ *H03F 3/2173* (2013.01); *B41J 2/04541* (2013.01); *B41J 2/04555* (2013.01);
(Continued)

(58) Field of Classification Search
CPC ......... H03F 3/2173; H03F 3/2178; H03F 1/02
See application file for complete search history.

(56) References Cited

U.S. PATENT DOCUMENTS 6,486,643 B2 * 11/2002 Liu ........................... H03F 1/02
323/284
2002/0089316 A1 * 7/2002 Liu ................... H02M 7/53871
323/268

(Continued)

FOREIGN PATENT DOCUMENTS

EP        2395657 A1    12/2011

*Primary Examiner* — Lam S Nguyen
(74) *Attorney, Agent, or Firm* — Workman Nydegger

(57) ABSTRACT

It is disclosed an amplifier for driving a capacitive load, comprising an input terminal adapted to receive an input voltage signal, an output terminal adapted to drive the capacitive load, a linear amplification stage, switching amplification stage, a capacitor, a first switch and a measurement and control circuit. The measurement and control circuit is configured to: measure the value of the current generated at the output from the linear amplification stage and generate a driving voltage signal of the switching amplification stage; generate the first switching signal to open the first switch and generate an enabling signal to enable the operation of at least part of the switching amplification stage; generate the first switching signal to close the first switch and generate the enabling signal to disable the operation of the switching amplification stage; generate the first switching signal to open the first switch.

11 Claims, 6 Drawing Sheets

(51) Int. Cl.
*B41J 2/045* (2006.01)
*G01R 19/165* (2006.01)
*G05F 1/46* (2006.01)
*H03F 1/32* (2006.01)
*H03F 3/21* (2006.01)

(52) U.S. Cl.
CPC ....... *B41J 2/04581* (2013.01); *B41J 2/04588* (2013.01); *G01R 19/16538* (2013.01); *G05F 1/461* (2013.01); *H03F 1/0238* (2013.01); *H03F 1/3205* (2013.01); *H03F 3/211* (2013.01); *H03F 2200/297* (2013.01); *H03F 2200/432* (2013.01); *H03F 2200/462* (2013.01)

(56) References Cited

U.S. PATENT DOCUMENTS

| | | |
|---|---|---|
| 2004/0075500 A1 | 4/2004 | Inokuchi |
| 2005/0231179 A1 | 10/2005 | Ishizaki |
| 2006/0132231 A1* | 6/2006 | Ishii ................. H03F 3/2173 330/10 |
| 2014/0306763 A1 | 10/2014 | Hong et al. |

* cited by examiner

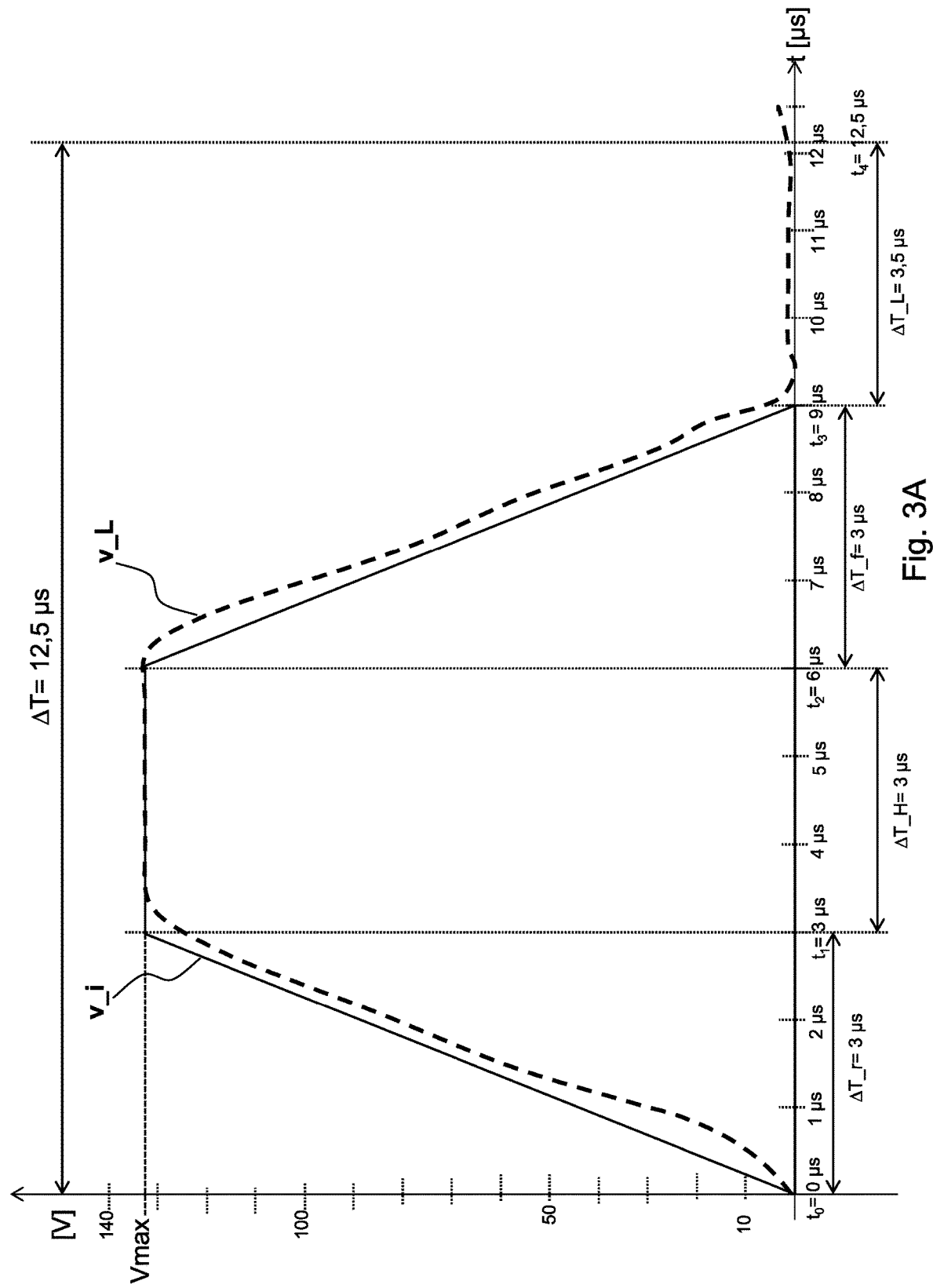

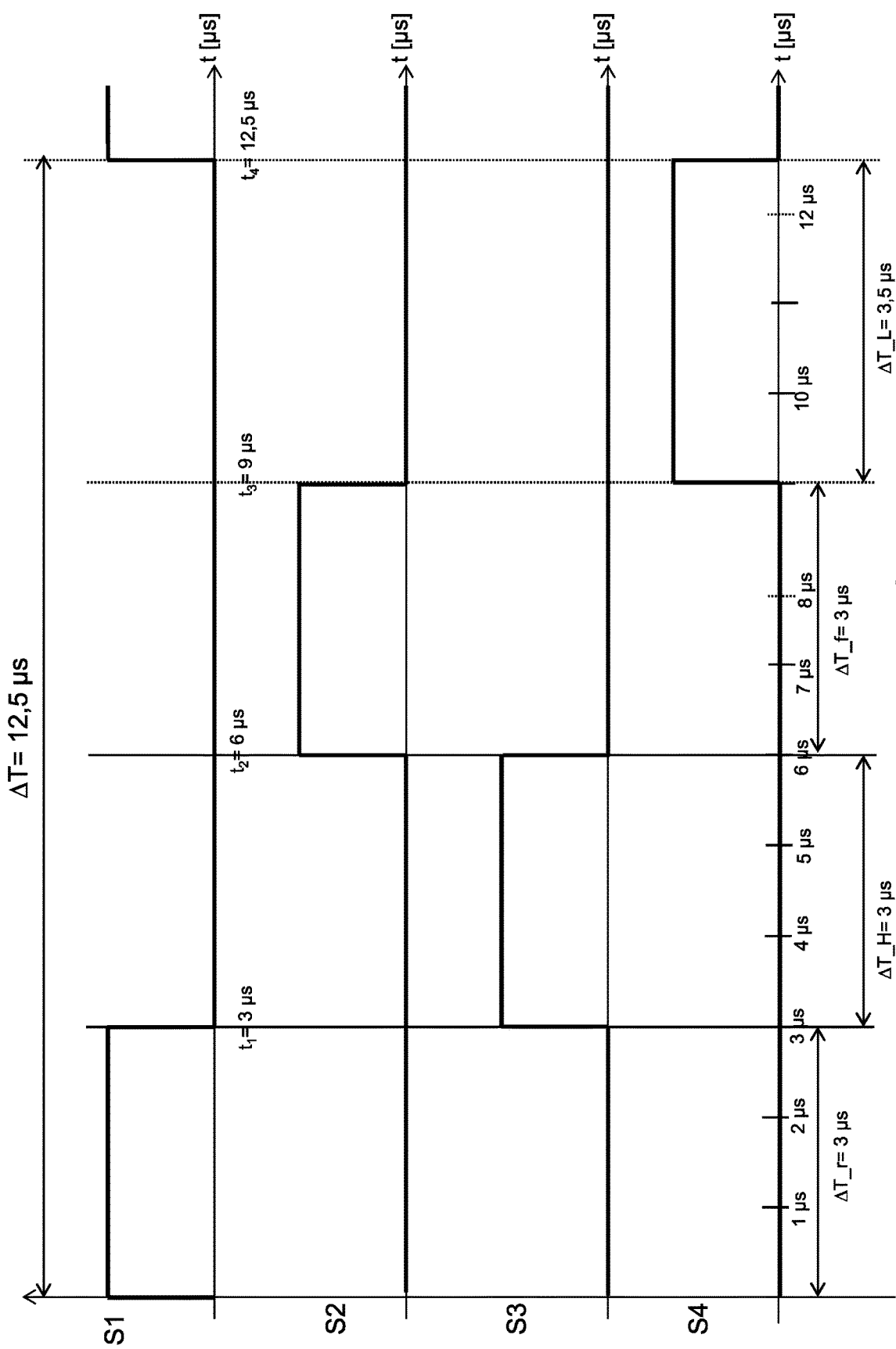

AMPLIFIER FOR DRIVING A CAPACITIVE LOAD

BACKGROUND

Technical Field

The present disclosure generally relates to the electronics field.

More in particular, the present disclosure concerns an amplifier of a parallel hybrid type for driving a capacitive load, such as, for example, piezoelectric print heads.

Description of the Related Art

Different electronic amplifier circuits for driving a capacitive load, such as, for example, print heads of a piezoelectric type, are known.

A first example of an electronic amplifier circuit for driving a capacitive load is a linear amplifier (for example in class AB), which allows to obtain a high fidelity of reproduction of the desired waveform across the capacitive load (i.e. reduced signal distortion), but it has the disadvantage of dissipating a high amount of power (i.e. it has low efficiency) and of not recovering the energy stored into the capacitive load when the latter is discharged.

A second example of an electronic amplifier circuit for driving a capacitive load is the switching amplifier (commonly indicated as class D), which allows to minimize the power dissipated (i.e. it has high efficiency), but it has the disadvantage that the fidelity of reproduction of the desired waveform across the capacitive load is reduced (i.e. high distortion) when a large bandwidth and a high slew rate of the desired voltage signal across the capacitive load are required.

Hybrid amplifiers for driving resistive loads are known.

Hybrid amplifiers are a combination of a linear amplifier (for example, in class AB) and a switching amplifier and thus seek to exploit the advantages provided by the two amplifiers.

More in particular, hybrid amplifiers can have an architecture of a serial or parallel type.

In hybrid amplifiers of a serial type, a linear amplification stage is connected in cascade with a switching amplification stage: in this case the switching amplification stage continuously changes the power supply of the linear amplification stage so as to decrease the power dissipated by the latter, but it is not possible to recover at least part of the energy stored into the capacitive load when it is discharged.

In hybrid amplifiers of a parallel type, the linear amplification stage is connected in parallel to the switching amplification stage: in this case, the linear amplification stage controls the voltage on the load, thus ensuring a low signal distortion, while the switching amplification stage manages most of the current on the load, thus obtaining a low dissipation of power (i.e. high efficiency).

Hybrid amplifiers of a parallel type are used for driving resistive and resistive-inductive loads, such as, for example, audio speakers.

The Applicant has noted that if the known hybrid amplifiers of a parallel type were used for driving a capacitive load (such as, for example, piezoelectric print heads), in order to obtain a low current output from the linear amplifier stage in a wide range of values of the capacitive load it is necessary to have a very high switching frequency (for example, at least equal to 10 MHz) in the devices making up the switching amplification stage, which requires the use of high-performance electronic devices and above all it increases the power dissipated (i.e. it decreases efficiency), thus cancelling out at least in part the advantage of using a parallel hybrid amplifier.

BRIEF SUMMARY

The present disclosure relates to an amplifier for driving a capacitive load as defined in the enclosed claim 1 and by the preferred embodiments thereof described in the dependent claims 2 to 10.

The Applicant has perceived that the amplifier according to the present disclosure is capable of amplifying an input signal with a very high slew rate for the purpose of driving one or more capacitive loads, while maintaining a reduced distortion thanks to the presence of a linear amplification stage and maintaining a reduced power dissipation thanks to the presence of a switching amplification stage, without requiring an excessive increase in the switching frequency of the switching amplification stage for a wide range of values of the capacitive load.

Furthermore, the amplifier according to the present disclosure allows a large part of the energy stored into the capacitive load to be recovered when the load it discharged, thus further reducing energy consumption and thereby decreasing the consequent dissipative losses.

One embodiment of the present disclosure is a piezoelectrically-driven inkjet print head as defined in the enclosed claim 10.

BRIEF DESCRIPTION OF THE SEVERAL VIEWS OF THE DRAWINGS

Further characteristics and advantages of the disclosure will emerge from the following description of a preferred embodiment and variants thereof, said description being provided by way of example with reference to the attached drawings, of which:

FIG. 3A schematically shows a possible trend in the voltage signal at the input of the amplifier and the signal generated at the output on a capacitive load driven by the amplifier of the disclosure;

FIG. 3C shows a possible trend in the switching signals of two switches included in the amplifier of FIG. 1 and it shows a possible trend of two enabling signals of a switching amplification stage included in the amplifier of the disclosure.

DETAILED DESCRIPTION

It should be noted that in the description below, even if they appear in different embodiments of the disclosure, identical or similar blocks, components or modules are indicated by the same numerical references in the figures.

Figure 1:
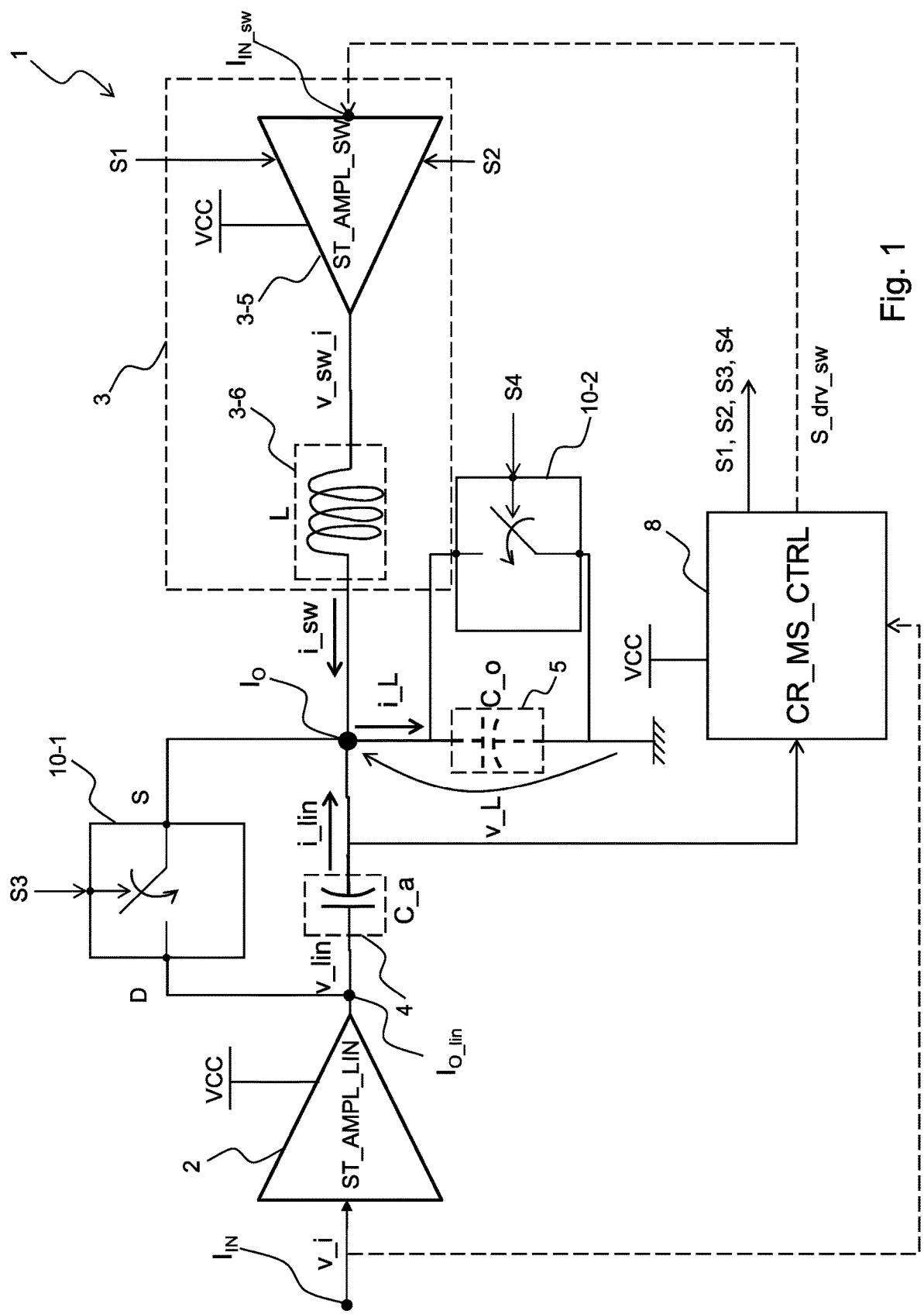
FIG. 1 shows a block diagram of an amplifier of a parallel hybrid type according to the disclosure.

With reference to FIG. 1, it shows an amplifier 1 of a parallel hybrid type according to one embodiment of the disclosure.

The amplifier 1 is an electronic circuit which has the function of driving one or more capacitive loads, such as, for example, one or more piezoelectric print heads.

For the purpose of explaining the application it is assumed, for the sake of simplicity, that the amplifier 1 is structured to drive a single capacitive load 5 (as shown in FIG. 1) having a capacitance C_o; more in general the amplifier 1 is structured to drive two or more capacitive loads connected to each other in parallel and having an equivalent capacitance equal to C_o.

For example, the capacitive load 5 consists of one or more piezoelectric print heads, and it has values of the equivalent capacitance C_o comprised between 160 pF (in the case of a piezoelectrically-driven inkjet print head) and 160 nF (in the case of 1024 piezoelectric print heads connected in parallel).

The amplifier 1 comprises:
- an input terminal $I_{IN}$ adapted to receive an input voltage signal v_i;
- an output terminal $I_O$ adapted to generate an output voltage signal v_L for driving the capacitive load 5;
- an amplification stage 2 of the linear type;
- an amplification stage 3 of a switching type;
- a capacitor 4;
- a first switch 10-1;
- a measurement and control circuit 8;
- a second switch 10-2.

The amplifier 1 is of the parallel hybrid type, wherein the amplification stage 2 of the linear type is connected in parallel to the amplification stage 3 of a switching type, so that the current i_L flowing through the capacitive load C_o is equal to the sum of the current i_lin generated at the output from the linear amplification stage 2 and the current i_sw generated at the output from the switching amplification stage 3, i.e. i_L=i_lin+i_sw.

The input terminal $I_{IN}$ of the amplifier 1 is adapted to receive an input voltage signal v_i having a substantially trapezoidal trend with upward and downward phases, monotonically increasing and decreasing, respectively, as shown with the continuous line in FIG. 3A.

More in general, the input voltage signal v_i is periodic and each period ΔT has a substantially trapezoidal trend.

With reference to a period of the input voltage signal v_i, it is composed of four phases (again see FIG. 3A):
- a first phase comprised between the instant to and the instant $t_1$, in which the input voltage signal v_i has a trend monotonically increasing from a substantially null value to a maximum voltage value Vmax substantially equal to the value of a supply voltage VCC (for example, equal to 137 V);
- a second phase comprised between the instant $t_1$ and the instant $t_2$, in which the input voltage signal v_i has a substantially constant trend equal to the maximum voltage value Vmax;
- a third phase comprised between the instant $t_2$ and the instant $t_3$, in which the input voltage signal v_i has a trend monotonically decreasing from the maximum voltage value Vmax to the null value;
- a fourth phase comprised between the instant $t_3$ and the instant $t_4$, in which the input voltage signal v_i has a substantially constant trend equal to the null value.

It is thus possible to identify four respective operating phases of the amplifier 1.

In one embodiment, in the first phase comprised between to and the input voltage signal v_i is an upward ramp having a trend increasing linearly from a null value to a maximum voltage value Vmax; similarly, in the third phase comprised between $t_2$ and $t_3$, the input voltage signal v_i is a downward ramp having a trend decreasing linearly from the maximum voltage value Vmax to the null value.

For example, the value of the period ΔT is equal to 12.5 microseconds, the maximum voltage value Vmax is equal to 135 Volts, the duration of the first phase (upward ramp) is equal to 3 microseconds, the duration of the second phase (substantially constant maximum value) is equal to 3 microseconds, the duration of the third phase (downward ramp) is equal to 3 microseconds and the duration of the fourth phase (substantially constant null value) is equal to 3.5 microseconds.

The input voltage signal v_i thus has a high slew rate (i.e. it has large variations of its value in short time intervals) and it has a high frequency of repetition of the signal itself.

The output terminal $I_O$ of the amplifier 1 is adapted to generate the output voltage signal v_L, which also has a substantially trapezoidal trend with monotone upward and downward phases increasing and decreasing, respectively (typically an upward ramp increasing linearly and a downward ramp decreasing linearly), as shown with the broken line in FIG. 3A.

It can be seen that the output voltage signal v_L fluctuates between a null value (i.e. the ground reference voltage) and the maximum value Vmax.

Furthermore, in FIG. 3A it can be seen that the output voltage signal v_L is also composed of four phases in each period, like the input voltage signal v_i, with the difference that the duration of the four phases is slightly shifted relative to that of the input voltage signal v_i.

The linear amplification stage 2 is powered by the supply voltage VCC and it comprises an input terminal adapted to receive the input voltage signal v_i and it comprises an output terminal adapted to generate an amplified voltage signal v_lin which reproduces the input voltage signal v_i and adapted to generate an output current i_lin.

The linear amplification stage 2 is active during all four operating phases.

In particular, during the second and fourth operating phase, the linear amplification stage 2 has the function of imposing with precision the value of the output voltage v_L desired across the capacitive load 5 (or on the output terminal $I_O$ of the amplifier 1), as will be explained in greater detail below.

The linear amplification stage 2 is in particular of the class AB type.

The amplification stage 3 of a switching type comprises an input terminal $I_{IN\_sw}$ adapted to receive a driving voltage signal S_drv_sw, it comprises at least a further input terminal adapted to receive a first and a second enabling signal S1, S2 and it comprises an output terminal adapted to generate the output voltage signal v_L, which oscillates between the value of a supply voltage VCC and the ground reference voltage, as will be explained in greater detail below, and adapted to generate an output current i_sw.

The current i_L which flows in the capacitive load 5 is given by the sum of the current i_lin generated at the output of the linear amplification stage 2 and of the current i_sw generated at the output of the switching amplification stage 3, i.e. i_L=i_lin+i_sw.

The switching amplification stage 3 has the function of managing most of the current on the capacitive load 5 during the first phase of the input voltage signal v_i having a trend with an upward ramp and during the third phase of the input voltage signal v_i having a trend with a downward ramp, so as to obtain a low power dissipation with recovery of the energy previously stored into the capacitive load 5 and thus low energy consumption.

Furthermore, the use of the switching amplification stage 3 allows a two-way current flow through the capacitive load 5, allowing most of the energy stored into the capacitive load 5 to be recovered.

It should be noted that the switching amplification stage 3 is driven by the measurement and control circuit 8 with a self-oscillating control, i.e. it is structured to measure the value of the current i_lin output from the linear amplifier 2 and it is structured to limit the current i_lin to a small value using a threshold or hysteresis control, as it will be explained in greater detail below.

Figure 2A:
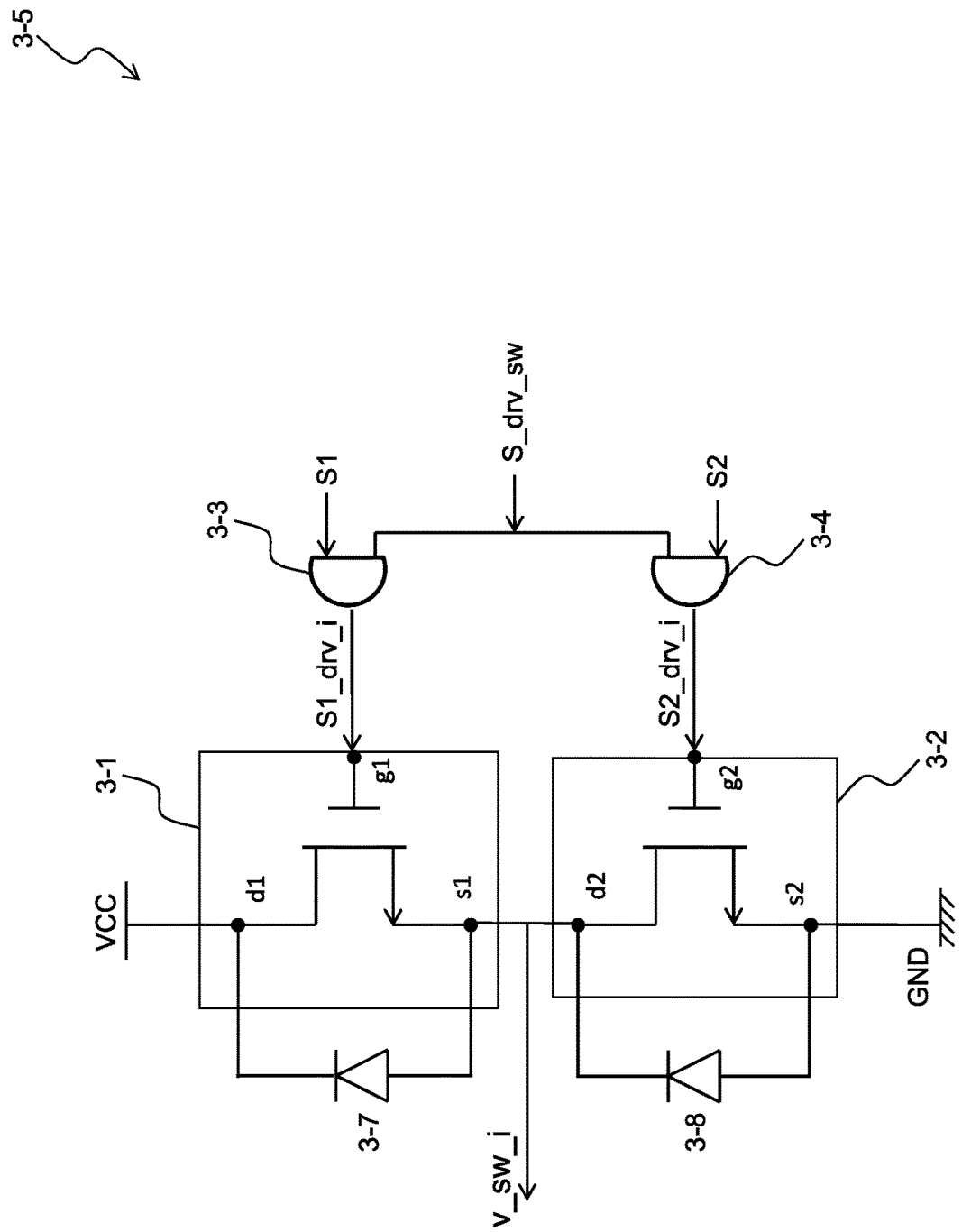
FIG. 2A shows more in detail a switching amplification stage included in the amplifier of FIG. 1.

More in particular, with reference to FIGS. 1 and 2A, the switching amplification stage 3 comprises:

a switching amplification circuit 3-5;

an inductor 3-6 connected in series to the switching amplification circuit 3-5, wherein the inductor 3-6 has one terminal connected to the output of the switching amplification circuit 3-5 and another terminal connected to the output terminal $l_O$ of the amplifier 1.

It should be noted that the set of the inductor 3-6 and of the capacitive load 5 forms a low-pass filter.

The switching amplification circuit 3-5 is powered by the supply voltage VCC (equal, for example, to 137 V) and it comprises in turn:

a first input terminal adapted to receive the first enabling signal S1;

a second input terminal adapted to receive the second enabling signal S2;

a third input terminal adapted to receive the driving voltage signal S_drv_sw;

an output terminal adapted to generate an internal switching voltage signal v_sw_i.

More in particular, the switching amplification circuit 3-5 comprises:

an upper side switch 3-1 having a first terminal connected towards the supply voltage VCC, wherein the upper side switch 3-1 is configured to switch between an open position wherein it is electrically equivalent to an open circuit and a closed position wherein it is electrically equivalent to a short circuit, as a function of the value of a first internal driving signal S1_drv_i;

a lower side switch 3-2 connected in series to the upper side switch 3-1, the lower side switch 3-2 having a first terminal connected to a second terminal of the upper side switch 3-1 and a second terminal connected towards a ground reference voltage, wherein the lower side switch 3-2 is configured to switch between an open position wherein it is electrically equivalent to an open circuit and a closed position wherein it is electrically equivalent to a short circuit, as a function of the value of a second internal driving signal S2_drv_i;

in particular, a diode connected in parallel to the switches 3-1, 3-2;

a first enabling circuit 3-3 having the function of controlling the opening/closing of the upper side switch 3-1, as a function of the value of the first enabling signal S1 and of the value of the driving voltage signal S_drv_sw;

a second enabling circuit 3-4 having the function of controlling the opening/closing of the lower side switch 3-2, as a function of the value of the second enabling signal S2 and of the value of the driving voltage signal S_drv_sw.

The upper side switch 3-1 has the function of controlling, when closed, the generation of the internal switching voltage signal v_sw (and thus of the output voltage signal v_L) equal to the value of the supply voltage VCC, whereas the lower side switch 3-2 has the function of controlling, when closed, the generation of the internal switching voltage signal v_sw (and thus of the output voltage signal v_L) equal to the value of the ground reference voltage (i.e. null value).

The switching amplification circuit 3-5 is thus structured to generate the internal switching voltage signal v_sw_i, which oscillates between the value of the supply voltage VCC and the ground reference voltage (i.e. the null value), as a function of the closed state of the upper side switch 3-1 and of the closed state of the lower side switch 3-2, respectively.

Therefore the switching amplification stage 3 is structured to impose an output voltage signal v_L equal to the supply voltage VCC when the upper side switch 3-1 is closed and it is structured to impose an output voltage signal v_L equal to the ground reference voltage (i.e. 0 Volts) when the lower side switch 3-2 is closed.

More in particular, the first enabling circuit 3-3 comprises an output terminal adapted to generate the first internal driving signal S1_drv_i equal to the driving voltage signal S_drv_sw when the first enabling signal S1 has a high logic value (for example, equal to the supply voltage VCC), and it is configured to generate at the output the first internal driving signal S1_drv_i equal to a low logic value (for example, null) when the first enabling signal S1 has a low logic value.

Similarly, the second enabling circuit 3-4 is configured to generate at the output the second internal driving signal S2_drv_i equal to the driving voltage signal S_drv_sw when the second enabling signal S2 has a high logic value (in the example considered equal to the supply voltage VCC), and it is configured to generate at the output the second internal driving signal S2_drv_i equal to a low logic value (for example null) when the second enabling signal S2 has a low logic value.

The first and second enabling circuits 3-3, 3-4 are implemented, for example, with a respective logic port of AND type.

In one embodiment, the switching amplification circuit 3-5 is of the half-bridge class D type and the upper side switch 3-1 is implemented with an n-channel MOSFET transistor having a drain terminal connected to the supply voltage VCC, a source terminal connected to the output terminal of the switching amplification circuit 3-5 and a gate terminal connected to the output of the first enabling circuit 3-3: therefore the source terminal carries the internal switching voltage signal v_sw_i and the gate terminal receives the first internal driving signal S1_drv_i.

The lower side switch 3-2 is similarly implemented with an n-channel MOSFET transistor having a source terminal connected to the ground reference voltage, a drain terminal connected to the output terminal of the switching amplification circuit 3-5 and a gate terminal connected to the output of the second enabling circuit 3-4: therefore the drain terminal carries the internal switching voltage signal v_sw_i and the gate terminal receives the second internal driving signal S2_drv_i.

In one embodiment, the switching amplification circuit 3-5 further comprises a first free-wheeling diode 3-7 connected in parallel to the MOSFET transistor 3-1 and having a cathode terminal connected to the drain terminal of the MOSFET transistor 3-1 (and thus connected to the supply voltage VCC) and an anode terminal connected to the source terminal of the MOSFET transistor 3-1 (and thus connected to the output terminal of the switching amplification circuit 3-5 carrying the internal switching voltage signal v_sw_i).

Similarly, the switching amplification circuit 3-5 further comprises a second free-wheeling diode 3-8 connected in parallel to the MOSFET transistor 3-2 and having a cathode terminal connected to the drain terminal of the MOSFET transistor 3-2 (and thus it carries the internal switching voltage signal v_sw_i) and an anode terminal connected to the source terminal of the MOSFET transistor 3-2 (and thus connected to the ground reference voltage).

The capacitor 4 is connected in series to the output terminal $I_{O\_lin}$ of the linear amplification stage 2 and it has the function of increasing the impedance seen from the linear amplification stage 2, thus limiting the current output from the linear amplification stage 2 to a low value in the phases of the input voltage signal v_i having a trend with an upward and downward ramp.

In particular, the capacitor 4 has one terminal connected to the output terminal $I_{O\_lin}$ of the linear amplification stage 2 and another terminal connected to the output terminal $I_O$ of the amplifier 1 and to the output terminal of the switching amplification stage 3.

The first switch 10-1 is connected in parallel to the capacitor 4 and it is configured to switch between an open position wherein it is electrically equivalent to an open circuit and a closed position wherein it is electrically equivalent to a short circuit, as a function of the value of a first switching signal S3.

The first switch 10-1 has the function of by-passing the capacitor 4 in the second phase with a substantially constant trend (greater than zero) of the input voltage signal v_i (i.e. the output terminal of the linear amplification stage 2 is short-circuited with the output terminal $I_O$ of the amplifier 1), allowing to the linear amplification stage 2 to set with precision the value of the output voltage v_L at the ends of the capacitive load 5.

The second switch 10-2 is connected in parallel to the capacitive load 5 and it is configured to switch between an open position wherein it is electrically equivalent to an open circuit and a closed position wherein it is electrically equivalent to a short circuit, as a function of the value of a second switching signal S4.

The second switch 10-2 has the function of short-circuiting the capacitive load 5 in the fourth phase with a substantially null trend in the input voltage signal v_i, so as to bring any voltage slightly greater than zero present on the capacitive load 5 towards the null value at the end of the third phase.

It should be noted that the use of the second switch 10-2 is not essential for the purposes of the disclosure, since the same function of discharging the capacitive load 5 towards the null value can be obtained by closing the first switch 10-1 and the linear amplification stage 2, which is structured to generate (during the fourth operating phase) at the output the substantially null amplified voltage signal v_lin, as it will be explained in greater detail below.

The measurement and control circuit 8 is powered by the supply voltage VCC and it has the function of measuring the current i_lin generated at the output from the linear amplification stage 2 and of generating suitable values of the driving voltage signal S_drv_sw so as to perform a self-oscillating control of the switching amplification stage 3, by means of a threshold or hysteresis control of the measured value of the current i_lin generated at the output from the linear amplification stage: in this way the current generated from the linear amplification stage 2 is limited to a low value during the phases of the input voltage signal v_i having a trend with an upward and downward ramp.

The measurement and control circuit 8 thus comprises an output terminal adapted to generate, as a function of the value of the current i_lin generated at the output from the linear amplification stage 2, the driving voltage signal S_drv_sw for driving the switching amplification stage 3.

Alternatively, the measurement and control circuit 8 is modified in such a way as to control the switching amplification stage 3 as a function of the measurement of the voltage drop (i.e. potential difference) across the capacitor 4 (rather than as a function of the measured current i_lin).

For the purpose of explaining the application, it is considered in the description that follows the measurement and control circuit 8 which performs the measurement of the current i_lin generated at the output from the linear amplification stage 2, but similar considerations apply in cases in which the measurement and control circuit 8 performs a measurement of the voltage drop across the capacitor 4.

The measurement and control circuit 8 has the further function of generating suitable values of the first and second enabling signals S1, S2 and of the first and second switching signals S3, S4.

The measurement and control circuit 8 thus further comprises at least one output terminal adapted to generate:
- the first and the second enabling signal S1, S2 to enable operation of the switching amplification stage 3 in the first upward ramp phase and in the third downward ramp phase of the input voltage signal v_i;
- the first switching signal S3 to control the opening and closing of the first switch 10-1;
- the second switching signal S4 to control the opening and closing of the second switch 10-2.

With reference more in particular to FIG. 3C, the measurement and control circuit 8 is configured to generate:
- the first enabling signal S1 having a high logic value to enable the operation of a portion of the switching amplification stage 3 during the first phase (upward ramp) of the input voltage signal v_i and having a low logic value to disable the operation of said portion of the switching amplification stage 3 during the second, third and fourth phases of the input voltage signal v_i;
- the second enabling signal S2 having a high logic value to enable the operation of a further portion of the switching amplification stage 3 in the third phase (downward ramp) of the input voltage signal v_i and having a low logic value to disable the operation of said further portion of the switching amplification stage 3 during the first, second and fourth phases of the input voltage signal v_i;
- the first switching signal S3 having a high logic value to close the switch 10-1 during the second phase (maximum constant trend) of the input voltage signal v_i wherein the linear amplification stage 2 is structured to impose with precision the value of the output voltage v_L, and having a low logic value during the first, third and fourth phases of the input voltage signal v_i;
- the second switching signal S4 having a high logic value to close the switch 10-2 during the fourth phase (null trend) of the input voltage signal v_i and having a low logic value during the first, second and third phases of the input voltage signal v_i.

Figure 2B:
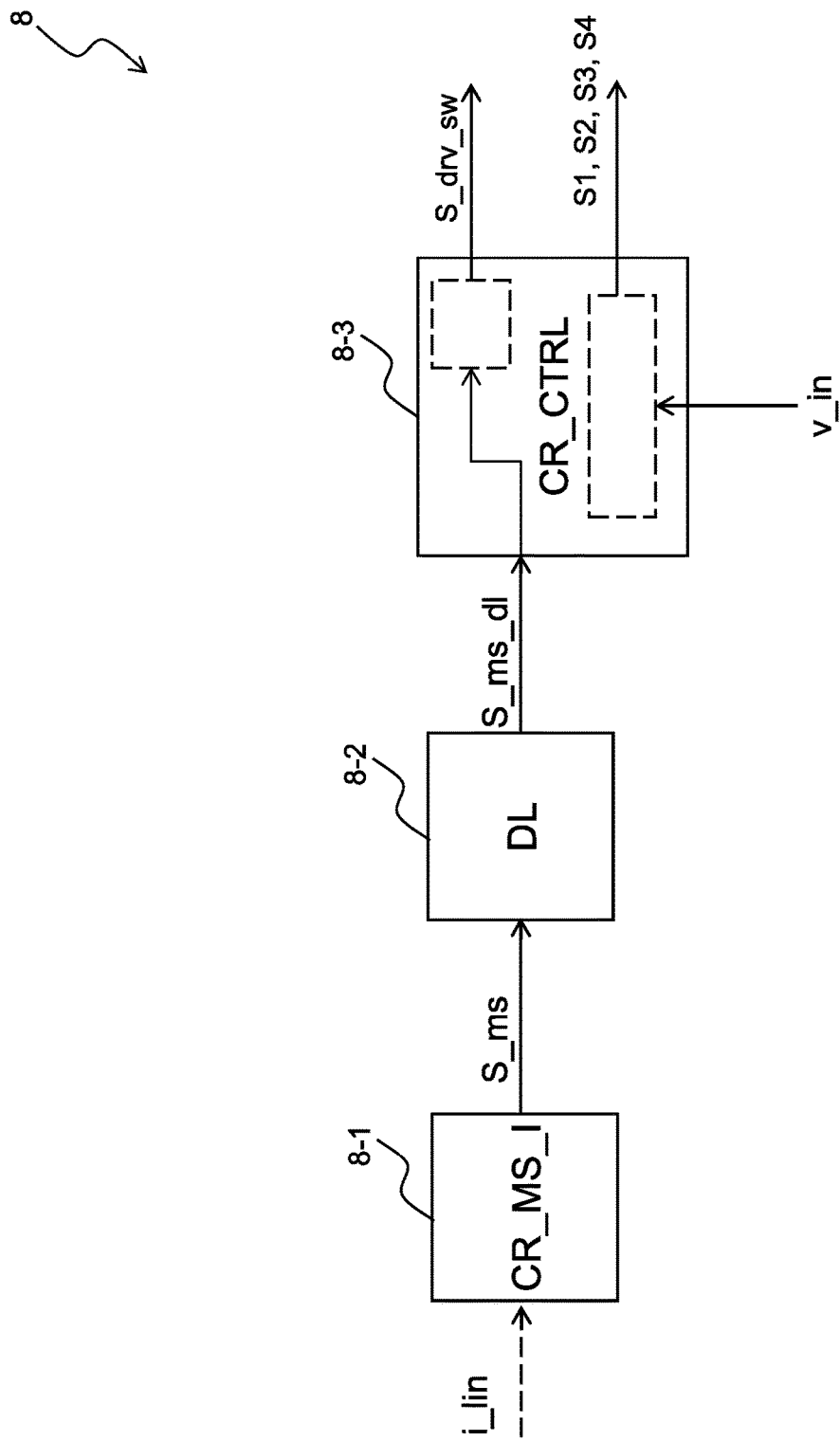
FIG. 2B shows more in detail a measurement and control circuit included in the amplifier of FIG. 1.

It should be noted that the enabling signals S1, S2 and the switching signals S3, S4 can be generated by means of the measurement and control circuit 8 (in particular, by means of the control circuit 8-3 illustrated below) which receives at the input the input signal v_i (as shown in FIG. 2B), it performs an analysis of the trend in its trapezoidal waveform and generates therefrom the particular trends of the signals S1, S2, S3, S4, as shown in FIG. 3C.

Alternatively, the enabling signals S1, S2 and the switching signals S3, S4 can be generated synchronously to the input signal v_i with a trapezoidal trend by means of a unit external to the amplifier 1, which generates the first enabling signal S1 having a high logic value (and the signals S2, S3, S4 having low logic values) when the input signal v_i is an upward ramp, generates the first switching signal S3 having a high logic value (and the signals S1, S2, S4 having low values) when the input signal v_i is a high constant value, generates the second enabling signal S2 having a high logic value (and the signals S1, S3, S4 having low logic values) when the input signal v_i is a downward ramp, and generates the second switching signal S4 having a high logic value (and the signals S1, S2, S3 having low logic values) when the input signal v_i is a low constant value (typically null).

With reference to FIG. 2B, it shows more in detail a block diagram of the measurement and control circuit 8, which comprises the connection in series of a current measurement circuit 8-1, a control circuit 8-3 and, in particular, a delayer 8-2.

The current measurement circuit 8-1 has the function of measuring the sign (that is, the direction in which it flows) of the current i_lin generated at the output from the linear amplification stage 2 and of generating a current measurement signal S_ms indicative of the positive or negative value of the current i_lin generated at the output from the linear amplification stage 2.

The delayer 8-2 has the function of delaying the current measurement signal S_ms, so as to limit the switching frequency of the switches 3-1, 3-2 in the event that the capacitive load 5 has very low values.

The control circuit 8-3 has the function of generating suitable values of the driving voltage signal S_drv_sw for performing the self-oscillating control of the switching amplification stage 3, by means of a threshold control of the measured value of the current i_lin or by means of a hysteresis control around the null value of the measured value of the current i_lin.

In the case of threshold control, when during the first upward phase of the output voltage signal v_L the measured value of the current i_lin generated at the output from the linear amplification stage 2 has a value greater than a threshold value (for example, equal to zero), the control circuit 8-3 is configured to generate the driving voltage signal S_drv_sw having a high logic value; when the measured value of the current i_lin generated at the output from the linear amplification stage 2 instead has a value lower than the threshold value (in the example, lower than zero), the control circuit 8-3 is configured to generate the driving voltage signal S_drv_sw having a low logic value.

During the third downward phase of the output voltage signal v_L, the driving voltage signal S_drv_sw is equal to the negative of the driving voltage signal S_drv_sw during the first upward phase.

Therefore, during the first operating phase (upward ramp) of the input voltage signal v_i, the control circuit 8-3 is structured to generate the first enabling signal S1 having a high logic value which enables the upper side switch 3-1 of the switching amplification circuit 3-5 and it is structured to generate the second enabling signal S2 having a low logic value which disables the lower side switch 3-2: in this case, during the first phase the upper side switch 3-1 of the switching amplification circuit 3-5 is closed or opened as a function of the high or low logic value, respectively, of the driving voltage signal S_drv_sw generated by means of the threshold control, while the lower side switch 3-2 always remains open during the first phase.

Similarly, during the third operating phase (downward ramp) of the input voltage signal v_i, the control circuit 8-3 is structured to generate the second enabling signal S2 having a high logic value which enables the lower side switch 3-2 of the switching amplification circuit 3-5 and it is structured to generate the first enabling signal S1 having a low logic value which disables the upper side switch 3-1: in this case, during the third phase the lower side switch 3-2 of the switching amplification circuit 3-5 is closed or opened as a function of the high or low logic value, respectively, of the driving voltage signal S_drv_sw generated by means of the threshold control, while the upper side switch 3-1 always remains open during the third phase.

In the case of hysteresis control, the previous considerations relating to the threshold control are applicable in an analogous manner, replacing the comparison with a first threshold value greater than zero to generate the driving voltage signal S_drv_sw having a high logic value and replacing the comparison with a second threshold value lower than zero to generate the driving voltage signal S_drv_sw having a low logic value.

The use of a hysteresis control (as opposed to the threshold control) has the advantage of avoiding activating the operation of the switching amplification stage 3 for small positive/negative variations in the value of the current i_lin around the null value.

Therefore, in the case of hysteresis control, when during the first upward phase the measured value of the current i_lin generated at the output from the linear amplification stage 2 has a value greater than a first threshold value greater than zero, the control circuit 8-3 is configured to generate the driving voltage signal S_drv_sw having a high logic value; when the measured value of the current i_lin generated at the output from the linear amplification stage 2 instead has a value lower than a second threshold value lower than zero, the control circuit 8-3 is configured to generate the driving voltage signal S_drv_sw having a low logic value.

Therefore, during the first operating phase (upward ramp) of the input voltage signal v_i, the control circuit 8-3 is structured to generate the first enabling signal S1 having a high logic value which enables the upper side switch 3-1 of the switching amplification circuit 3-5 and it is structured to generate the second enabling signal S2 having a low logic value which disables the lower side switch 3-2: in this case, during the first phase the upper side switch 3-1 of the switching amplification circuit 3-5 is closed or opened as a function of the high or low logic value, respectively, of the driving voltage signal S_drv_sw generated by means of the threshold control, while the lower side switch 3-2 always remains open during the first phase.

Similarly, during the third operating phase (downward ramp) of the input voltage signal v_i, the control circuit 8-3 is structured to generate the second enabling signal S2 having a high logic value which enables the lower side switch 3-2 of the switching amplification circuit 3-5 and is structured to generate the first enabling signal S1 having a low logic value which disables the upper side switch 3-1: in this case, during the third phase the lower side switch 3-2 of the switching amplification circuit 3-5 is closed or opened as a function of the high or low logic value, respectively, of the driving voltage signal S_drv_sw generated by means of the threshold control, while the upper side switch 3-1 always remains open during the third phase.

Figure 3B:
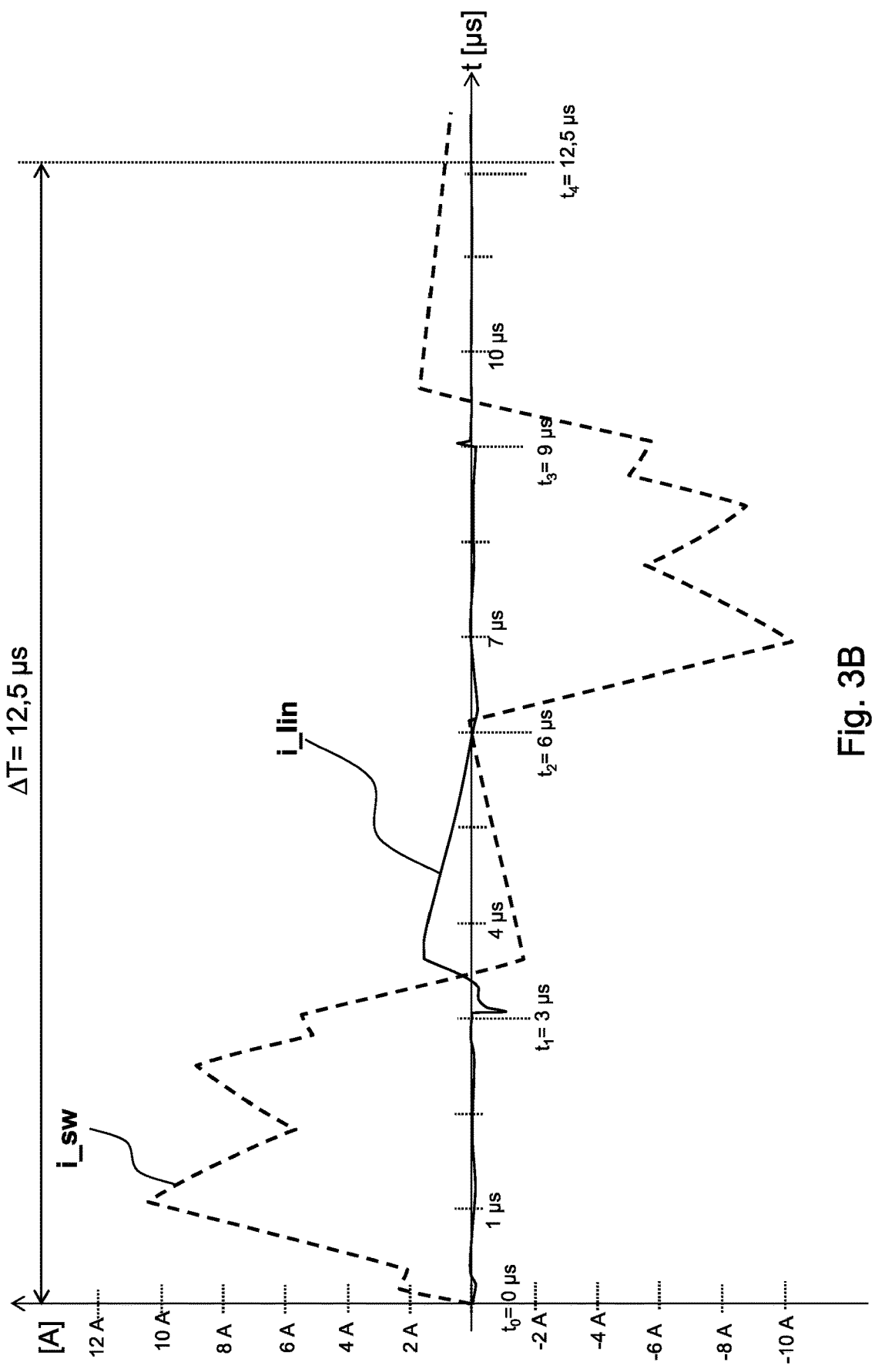
FIG. 3B schematically shows a possible trend in the output current signals generated by the linear amplification stage and by the switching amplification stage included in the amplifier of FIG. 1.

With reference to FIG. 3B, it shows with a continuous line a possible trend in the current signal i_lin generated at the output from the linear amplification stage 2 and it shows with a broken line a possible trend in the current signal i_sw generated at the output of the switching amplification stage 3.

It is possible to note that, during the first operating phase (corresponding to the upward ramp of the input voltage signal v_i) and during the third operating phase (corresponding to the downward ramp of the input voltage signal v_i), the value of the current i_lin generated at the output of the linear amplification stage 2 has small values close to the null value, whereas the value of the current i_sw generated at the output of the switching amplification stage 3 has high values: therefore, during the first and third operating phases the operation of the switching amplification stage 3 is enabled, while the linear amplification stage 2 outputs a current i_lin limited to a small value close to zero due to the injection of current by the switching amplification stage 3.

It is further possible to note that during the second operating phase (corresponding to the maximum constant value of the input voltage signal v_i) the value of the current i_lin generated at the output from the linear amplification stage 2 has non-negligible values greater than zero, whereas the value of the current i_sw generated at the output from the switching amplification stage 3 has smaller values: therefore, during the second operating phase the linear amplification stage 2 imposes with precision the voltage on the output terminal thereof (and thus it imposes with precision the voltage on the output terminal $I_O$ of the amplifier 1, since the capacitor 4 is bypassed by means of the first switch 10-1, closed), while the operation of the switching amplification stage 3 is substantially disabled.

Finally, it is possible to note that during the fourth operating phase (corresponding to the constant null value of the input voltage signal v_i) the value of the current i_lin generated at the output from the linear amplification stage 2 is null and the value of the current i_sw generated at the output from the switching amplification stage 3 also has small values: therefore during the fourth operating phase the linear amplification stage 2 imposes a null value on the first terminal of the capacitor 4, while the operation of the switching amplification stage 3 is substantially disabled.

It will now be described the operation of the amplifier 1, making also reference to FIGS. 1, 2A-B and 3A-3C.

For the purpose of explaining the application, an input voltage signal v_i having a trapezoidal trend with a linearly increasing upward ramp and a linearly decreasing downward ramp is considered for the sake of simplicity.

It is further assumed that the enabling signals S1, S2 and the switching signals S3, S4 are generated by the measurement and control circuit 8, as a function of the input voltage signal v_i.

During the first operating phase comprised between the instants t₀ and $t_1$, the input voltage signal v_i is an upward ramp having a trend increasing linearly from a null value to a maximum voltage value Vmax and the switching amplification stage 3 operates so as to provide at the output a current i_sw towards the capacitive load 5, while the value of the output current i_lin of the linear amplification stage 2 is minimum.

During the first phase, the measurement and control circuit 8 generates the first enabling signal S1 having a high logic value which enables the operation of the upper side switch 3-1 of the switching amplification stage 3 and generates the second enabling signal S2 having a low logic value which disables the operation of the lower side switch 3-2 of the switching amplification stage 3.

Furthermore, the measurement and control circuit 8 generates the first switching signal S3 having a low logic value which opens the first switch 10-1; therefore, the capacitor 4 is connected between the output terminal of the linear amplification stage 2 and the output terminal $I_O$ of the amplifier 1 and thus the impedance seen at the output from the linear amplification stage 2 is increased: this contributes to keep low the value of the current generated by the linear amplification stage 2 during the first phase.

Furthermore, the measurement and control circuit 8 generates the second switching signal S4 having a low logic value which opens the second switch 10-2; therefore, the output terminal $I_O$ of the amplifier 1 is connected towards the ground reference through the capacitive load 5.

During the first phase, the measurement and control circuit 8 measures the current i_lin generated at the output of the linear amplification stage 2 and it generates the driving signal S_drv_sw oscillating between a high logic value in which the upper side switch 3-1 is closed (and thus the switching amplification stage 3 imposes the output voltage signal v_L equal to the supply voltage VCC) and a low logic value in which the upper side switch 3-1 is opened (and thus the switching amplification stage 3 imposes the output voltage signal v_L equal to the ground reference voltage by switching on the free-wheeling diode 3-8), thus performing the self-oscillating control of the switching amplification stage 3 which limits the value of the current output from the linear amplification stage 2 during the first phase.

During the second operating phase comprised between the instants $t_1$ and $t_2$, the input voltage signal v_i has a substantially constant trend equal to the maximum voltage value Vmax and the linear amplification stage 2 imposes with precision the value of the output voltage v_L desired across the capacitive load 5 (that is, on the output terminal $I_O$ of the amplifier 1), while the operation of the switching amplification stage 3 is disabled.

During the second phase, the measurement and control circuit 8 generates the first switching signal S3 having a high logic value which closes the first switch 10-1; therefore, the capacitor 4 is by-passed, i.e. the output terminal of the linear amplification stage 2 is short-circuited with the output terminal $I_{O\_lin}$ of the amplifier 1: the linear amplification stage 2 generated at the output the current i_lin necessary to charge the capacitive load 5 and the linear amplification stage 2 sets with precision the value of the output voltage v_L across the capacitive load 5, thus limiting the distortion of the output voltage signal v_L across the capacitive load 5.

Furthermore, during the second phase the measurement and control circuit 8 generates the first enabling signal S1 having a low logic value which disables the operation of the upper side switch 3-1 of the switching amplification stage 3 and generates the second enabling signal S2 having a low logic value which disables the operation of the lower side switch 3-2.

Furthermore, the measurement and control circuit 8 generates the second switching signal S4 having a low logic value which opens the second switch 10-2; therefore, the output terminal $I_O$ of the amplifier 1 is connected towards the ground reference through the capacitive load 5.

During the third operating phase, comprised between the instants $t_2$ and $t_3$, the input voltage signal v_i is a downward ramp having a trend decreasing linearly from the maximum voltage value Vmax to the null value and the switching amplification stage 3 operates so as to recover the energy previously stored into the capacitive load 5, while the value of the output current i_lin of the linear amplification stage 2 is minimum.

During the third phase, the measurement and control circuit 8 generates the second enabling signal S2 having a high logic value which enables the operation of the lower side switch 3-2 of the switching amplification stage 3 and generates the first enabling signal S1 having a low logic value which disables the operation of the upper side switch 3-1.

Furthermore, the measurement and control circuit 8 generates the first switching signal S3 having a low logic value which opens the first switch 10-1, thus the capacitor 4 is connected between the output terminal of the linear amplification stage 2 and the output terminal $I_O$ of the amplifier 1 and thus the impedance seen at the output from the linear amplification stage 2 is increased: this contributes to keep low the value of the current generated from the linear amplification stage 2 during the third phase.

Furthermore, the measurement and control circuit 8 generates the second switching signal S4 having a low logic value which opens the second switch 10-2, thus the output terminal $I_O$ of the amplifier 1 is connected towards the ground reference through the capacitive load 5.

During the third phase, the measurement and control circuit 8 measures the current i_lin generated at the output from the linear amplification stage 2 and it generates the driving signal S_drv_sw oscillating between a high logic value in which the lower side switch 3-2 is closed (and thus the switching amplification stage 3 imposes the output voltage signal v_L equal to the ground reference voltage) and a low logic value in which the lower side switch 3-2 is opened (and thus the switching amplification stage 3 imposes the output voltage signal v_L equal to the supply voltage VCC by switching on the free-wheeling diode 3-7), thus performing the self-oscillating control of the switching amplification stage 3 which limits the value of the current output from the linear amplification stage 2 during the third phase.

During the fourth operating phase comprised between the instants t3 and $t_4$, the input voltage signal v_i has a substantially constant trend equal to the null value and the operation of the switching amplification stage 3 is disabled.

During the fourth phase the measurement and control circuit 8 generates the second switching signal S4 having a high logic value which closes the second switch 10-2; therefore, the output terminal $I_O$ of the amplifier 1 is connected directly to the ground reference voltage and the capacitive load 5 is short-circuited, any residual charge being discharged therefrom.

Furthermore, during the fourth phase the measurement and control circuit 8 generates the first enabling signal S1 having a low logic value which disables the operation of the upper side switch 3-1 of the switching amplification stage 3 and it generates the second enabling signal S2 having a low logic value which disables the operation of the lower side switch 3-2.

Alternatively, the second switch 10-2 is not present and in the fourth phase it is possible to obtain a complete discharge of the capacitive load 5 by means of the measurement and control circuit 8, which generates the first switching signal S3 having a high logic value which closes the first switch 10-1; therefore, the capacitor 4 is by-passed, that is the output terminal $I_{O\_lin}$ of the linear amplification stage 2 is short-circuited with the output terminal $I_O$ of the amplifier 1: the linear amplification stage 2 generates at the output the amplified voltage signal v_lin having a null value and sinks the current i_lin necessary to completely discharge the capacitive load 5, thus the linear amplification stage 2 sets the null value of the output voltage v_L across the capacitive load 5.

One embodiment of the present disclosure relates to an amplifier 1 for driving a capacitive load 5, the amplifier 1 comprising:

an input terminal $I_{IN}$ adapted to receive an input voltage signal v_i comprising a first phase with a trend monotonically increasing from a substantially null value to a maximum voltage value Vmax, a second phase with a substantially constant trend equal to the maximum voltage value Vmax and a third phase with a trend monotonically decreasing from the maximum voltage value Vmax to a minimum value lower than the maximum value;

an output terminal $I_O$ adapted to drive the capacitive load 5;

an amplification stage of the linear type 2 comprising an input terminal $I_{IN}$ adapted to receive the input voltage signal v_i and comprising an output terminal $I_{O\_lin}$;

an amplification stage 3 of a switching type, comprising an output terminal connected to the output terminal $I_O$ of the amplifier and an input terminal $I_{IN\_sw}$ adapted to receive a driving voltage signal S_drv_sw, the switching amplification stage 3 being configured to switch between a switched off mode and a switched on mode as a function of the value of a first and a second enabling signal S1, S2;

a capacitor 4 having a terminal connected to the output terminal of the linear amplification stage and having another terminal connected to the output terminal $I_O$ of the amplifier;

a first switch 10-1 connected in parallel to the capacitor 4 and configured to switch between a closed position and an open position, as a function of the value of a first switching signal S3;

a measurement and control circuit 8 configured to:
   measure the value of the current i_lin generated at the output from the linear amplification stage 2 and generate therefrom the driving voltage signal S_dr_sw of the switching amplification stage 3;
   during the first phase of the input signal, generate the first switching signal S3 to open the first switch 10-1 and generate the first enabling signal S1 to enable the operation of at least part of the switching amplification stage 3;
   during the second phase of the input signal, generate the first switching signal S3 to close the first switch 10-1 so as to short-circuit the output terminal of the linear amplification stage with the output terminal of the amplifier $I_O$ and charge the capacitive load, and generate the first and second enabling signals S1, S2 so as to disable the operation of the switching amplification stage 3;
   during the third phase of the input signal, generate the first switching signal S3 to open the first switch and generate the second enabling signal S2 to enable the operation of at least part of the switching amplification stage 3.

The first enabling signal S1 and the second enabling signal S2 of said embodiment are generated as a function of the value of the input signal v_i or else by means of a unit external to the amplifier 1.

According to an alternative embodiment of the disclosure, the capacitor 4 in series with the output terminal of the linear amplification stage 2 is not present; in this case, the measurement and control circuit 8 is modified in such a way as to control the switching amplification stage 3 as a function of the measurement of the difference between the amplified voltage signal v_lin and the output voltage signal v_L.

Said alternative embodiment of the disclosure relates to an amplifier for driving a capacitive load 5, the amplifier comprising:
 an input terminal $I_{IN}$ adapted to receive an input voltage signal v_i comprising a first phase with a trend monotonically increasing from a substantially null value to a maximum voltage value Vmax, a second phase with a substantially constant trend equal to the maximum voltage value Vmax and a third phase with a trend monotonically decreasing from the maximum voltage value Vmax to a minimum value lower than the maximum value;
 an output terminal $I_O$ adapted to generate an output voltage signal v_L for driving the capacitive load 5;
 an amplification stage of the linear type 2 comprising an input terminal $I_{IN}$ adapted to receive the input voltage signal v_i and comprising an output terminal adapted to generate an amplified voltage signal v_lin;
 an amplification stage of a switching type 3 comprising an output terminal connected to the output terminal $I_O$ of the amplifier and an input terminal $I_{IN\_sw}$ adapted to receive a driving voltage signal S_drv_sw, the switching amplification stage 3 being configured to switch between a switched off mode and a switched on mode as a function of the value of at least one enabling signal;
 a first switch 10-1 connected between the output terminal of the linear amplification stage 2 and the output terminal $I_O$ of the amplifier, the first switch being configured to switch between a closed position and an open position, as a function of the value of a first switching signal S3;
 a measurement and control circuit configured to:
  measure the value of the difference between the amplified voltage signal v_lin and the output voltage signal v_L;
  generate, as a function of the value of current or voltage measured, the driving voltage signal S_dr_sw of the switching amplification stage 3;
  during the first phase of the input signal, generate the first switching signal S3 to open the first switch 10-1 and generate at least one enabling signal to enable the operation of at least part of the switching amplification stage 3;
  during the second phase of the input signal, generate the first switching signal S3 to close the first switch 10-1 so as to short-circuit the output terminal of the linear amplification stage with the output terminal of the amplifier $I_O$ and charge the capacitive load, and generate the at least one enabling signal to disable the operation of the switching amplification stage 3;
  during the third phase of the input signal, generate the first switching signal S3 to open the first switch and generate at least one enabling signal to enable the operation of at least part of the switching amplification stage 3.

The first enabling signal 51 and the second enabling signal S2 of said alternative embodiment are generated as a function of the value of the input signal v_i or else by means of a unit external to the amplifier.

The invention claimed is:

1. An amplifier for driving a capacitive load, the amplifier comprising:
 an input terminal adapted to receive an input voltage signal comprising a first phase with a trend monotonically increasing from a substantially null value to a maximum voltage value, a second phase with a substantially constant trend equal to the maximum voltage value and a third phase with a trend monotonically decreasing from the maximum voltage value to a minimum value lower than the maximum value;
 an output terminal adapted to drive the capacitive load;
 an amplification stage of a linear type, comprising an input terminal adapted to receive the input voltage signal and comprising an output terminal;
 an amplification stage of a switching type, comprising an output terminal connected to the output terminal of the amplifier and an input terminal adapted to receive a driving voltage signal, the switching amplification stage being configured to switch between a switched off mode and a switched on mode as a function of a value of at least one enabling signal;
 a capacitor having a terminal connected to the output terminal of the linear amplification stage and having another terminal connected to the output terminal of the amplifier;
 a first switch connected in parallel to the capacitor and configured to switch between a closed position and an open position, as a function of a value of a first switching signal;
 a measurement and control circuit configured to:
  measure the value of the current generated at the output from the linear amplification stage and generate therefrom the driving voltage signal for the switching amplification stage;
  during the first phase of the input signal, generate the first switching signal to open the first switch and generate at least one enabling signal to enable operation of at least part of the switching amplification stage;
  during the second phase of the input signal, generate the first switching signal to close the first switch so as to short-circuit the output terminal of the linear amplification stage with the output terminal of the amplifier and charge the capacitive load, and to generate the at least one enabling signal so as to disable the operation of the switching amplification stage;
  during the third phase of the input signal, generate the first switching signal to open the first switch and generate at least one enabling signal to enable the operation of at least part of the switching amplification stage.

2. The amplifier according to claim 1, further comprising a second switch connected in parallel to the capacitive load and configured to switch between a closed position and an open position as a function of the value of a second switching signal,
 wherein the input voltage signal further comprises a fourth phase with a substantially constant trend equal to the minimum value, in particular a null value,
 and wherein the measurement and control circuit, during the fourth phase, is further configured to:
  generate the first switching signal to open the first switch;
  generate the second switching signal to close the second switch so as to short-circuit the output terminal of the amplifier towards a ground reference voltage and discharge the capacitive load to the value of the ground reference voltage;

generate the at least one enabling signal to disable operation of the switching amplification stage.

3. The amplifier according to claim 1, wherein the input voltage signal further comprises a fourth phase with a substantially constant trend equal to the minimum value, in particular a null value, and wherein the measurement and control circuit, during the fourth phase, is further configured to:
  generate the at least one enabling signal to disable operation of the switching amplification stage;
  generate the first switching signal to close the first switch, so as to drive the capacitive load with a voltage signal substantially equal to the minimum value and discharge the capacitive load to the value of the ground reference voltage;
and wherein the linear amplification stage is configured to generate at the output a null voltage value.

4. The amplifier according to claim 1, wherein the measurement and control circuit comprises:
  a current measurement circuit configured to measure the value of the current generated at the output from the linear amplification stage and generate therefrom a signal indicative of the positive or negative value of the measured current;
  a control circuit connected in series to the current measurement circuit and configured to perform a self-oscillating control of the switching amplification stage by means of an hysteresis control of the current measured at the output from the linear amplification stage;
wherein the control circuit is configured, during the first phase of the input voltage signal, to:
  receive a value of the measured current greater than a first threshold value and generate therefrom the driving voltage signal of the switching amplification stage having a high logic value;
  receive a value of the measured current lower than a second threshold value and generate therefrom the driving voltage signal of the switching amplification stage having a low logic value.

5. The amplifier according to claim 4, wherein the switching amplification stage is of the half-bridge Class D type and it comprises:
  a series connection of an upper side switch and a lower side switch, the upper side switch being connected towards a supply voltage and the lower side switch being connected towards a reference voltage lower than the supply voltage, in particular a ground reference voltage;
  an inductor connected between a terminal common to the upper and lower side switches and the output terminal of the amplifier;
  a first enabling circuit configured to control the opening/closing of the upper side switch, as a function of the value of a first enabling signal and of the value of the driving voltage signal;
  a second enabling circuit configured to control the opening/closing of the lower side switch, as a function of the value of a second enabling signal and of the value of the driving voltage signal;
wherein the measurement and control circuit is further configured to:
  during the first phase of the input signal, generate the first enabling signal to enable operation of the upper side switch and to generate the second enabling signal to disable operation of the lower side switch;
  during the second phase of the input signal, generate the first enabling signal to disable operation of the upper side switch and to generate the second enabling signal to disable operation of the lower side switch;
  during the third phase of the input signal, generate the second enabling signal to enable operation of the lower side switch and to generate the first enabling signal to disable operation of the upper side switch.

6. The amplifier according to claim 4, further comprising a delayer interposed between the current measurement circuit and the control circuit.

7. The amplifier according to claim 1, wherein the linear amplification stage is of the Class AB type and the switching amplification stage is of the Class D type.

8. The amplifier according to claim 1, wherein the measurement and control circuit is further configured to generate the at least one enabling signal and the first and second switching signal as a function of the input signal value.

9. The amplifier according to claim 1, comprising a substantially capacitive load electrically connected to the output terminal of the amplifier, wherein the capacitive load is at least one piezoelectrically-driven inkjet print head, and wherein the input signal has a substantially trapezoidal trend comprising, in the first phase, a ramp increasing linearly from the null value to the maximum value and in the third phase, a ramp decreasing linearly from the maximum value to the null value.

10. A piezoelectrically-driven inkjet print head, the head comprising an amplifier according to claim 1.

11. An amplifier for driving a capacitive load, the amplifier comprising:
  an input terminal adapted to receive an input voltage signal comprising a first phase with a trend monotonically increasing from a substantially null value to a maximum voltage value, a second phase with a substantially constant trend equal to the maximum voltage value and a third phase with a trend monotonically decreasing from the maximum voltage value to a minimum value lower than the maximum value;
  an output terminal adapted to generate an output voltage signal for driving the capacitive load;
  an amplification stage of the linear type, comprising an input terminal adapted to receive the input voltage signal and comprising an output terminal adapted to generate an amplified voltage signal;
  an amplification stage of a switching type comprising an output terminal connected to the output terminal of the amplifier and an input terminal adapted to receive a driving voltage signal, the switching amplification stage being configured to switch between a switched off mode and a switched on mode as a function of the value of at least one enabling signal;
  a first switch connected between the output terminal of the linear amplification stage and the output terminal of the amplifier, the first switch being configured to switch between a closed position and an open position, as a function of the value of a first switching signal;
  a measurement and control circuit configured to:
    measure the value of the difference between the amplified voltage signal and the output voltage signal;
    generate, as a function of the value of current or voltage measured, the driving voltage signal of the switching amplification stage;
    during the first phase of the input signal, generate the first switching signal to open the first switch and generate at least one enabling signal to enable the operation of at least part of the switching amplification stage;

during the second phase of the input signal, generate the first switching signal to close the first switch so as to short-circuit the output terminal of the linear amplification stage with the output terminal of the amplifier and charge the capacitive load, and generate the at least one enabling signal to disable the operation of the switching amplification stage;

during the third phase of the input signal, generate the first switching signal to open the first switch and generate at least one enabling signal to enable the operation of at least part of the switching amplification stage.

* * * * *